(12) United States Patent  
Deniz (10) Patent No.: US 8,859,368 B2  
(45) Date of Patent: Oct. 14, 2014

(54) SEMICONDUCTOR DEVICE INCORPORATING A MULTI-FUNCTION LAYER INTO GATE STACKS

(75) Inventor: Derya Deniz, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 13/602,839

(22) Filed: Sep. 4, 2012

(65) Prior Publication Data

US 2014/0061812 A1 Mar. 6, 2014

(51) Int. Cl.
| | |
|---|---|
| H01L 21/28 | (2006.01) |
| H01L 29/66 | (2006.01) |
| H01L 21/8238 | (2006.01) |
| H01L 27/092 | (2006.01) |
| H01L 29/49 | (2006.01) |

(52) U.S. Cl.
CPC .... *H01L 21/28008* (2013.01); *H01L 29/66545* (2013.01); *H01L 21/823842* (2013.01); *H01L 21/823878* (2013.01); *H01L 21/28194* (2013.01); *H01L 27/092* (2013.01); *H01L 21/28088* (2013.01); *H01L 29/4966* (2013.01)
USPC .......................................... 438/270; 257/369

(58) Field of Classification Search
USPC .......................................... 257/369; 438/270
See application file for complete search history.

(56) References Cited

U.S. PATENT DOCUMENTS

| | | | |
|---|---|---|---|
| 6,339,020 B1 | 1/2002 | Weihs et al. | |
| 2012/0309181 A1* | 12/2012 | Machkaoutsan et al. | 438/585 |
| 2013/0049134 A1* | 2/2013 | Sunamura | 257/392 |
| 2013/0161763 A1* | 6/2013 | Ando et al. | 257/408 |

OTHER PUBLICATIONS

"High-k dielectric", from Wikipedia, the free encyclopedia, Aug. 28, 2012, 4 pages. http://en.wikipedia.org/wiki/High-k . . . .
"Work function", from Wikipedia, the free encyclopedia, Aug. 28, 2012, 6 pages. http://en.wikipedia.org/wiki/ Work_function. . . .
Maksimov, E. G. et al., "Ab Initio Calculations of the Superconducting Transition Temperature for NbC at Varioius Pressures", JETP Letters, vol. 80, No. 8, 2004, pp. 548-551.
Hugosson, H. W. et al., "Surface energies and work functions of the transition metal carbides", Surface Science 557 (2004), pp. 243-254.

* cited by examiner

*Primary Examiner* — Zandra Smith
*Assistant Examiner* — Damian A Hillman
(74) *Attorney, Agent, or Firm* — Maxine L. Barasch; Keohana & D'Alessandro PLLC (57) ABSTRACT

Approaches are provided for forming a semiconductor device (e.g., a FET) having a multi-function layer (e.g., niobium carbide (NbC)) that serves as a work function layer and a gate metal layer in gate stacks of solid state applications. By introducing a single layer with multiple functions, total number of layers that needs processing (e.g., recessing) may be decreased. As such, the complexity of device integration and resulting complications may be reduced.

13 Claims, 6 Drawing Sheets

SEMICONDUCTOR DEVICE INCORPORATING A MULTI-FUNCTION LAYER INTO GATE STACKS

BACKGROUND

1. Technical Field

This invention relates generally to the field of semiconductors and, more particularly, to approaches for incorporating niobium carbide (NbC) as a multi-function layer (e.g., a work function and a gate metal layer) into gate stacks that are used for field effect transistors (FET) in semiconductor devices.

2. Related Art

In the semiconductor industry, transistors such as field effect transistors (FETs) are commonly utilized as integral parts of the devices. A FET may have both n-FET and p-FET components on which a set of gate stacks may be formed. In a typical assembly, these gate stacks may include various combinations of layers such as a high-k layer, work function (WF) layers such as titanium nitride (TiN) on p-FET and tantalum carbide (TaC) on n-FET, a gate metal such as tungsten (W) or aluminum (Al) and a capping layer. Moreover, different work function metals are typically required for n-FET versus p-FET gate stacks. Because the gate stacks may include different layers and/or compounds, various processing steps are generally required to form such devices. Such steps may include depositing layers, etching layers, forming recesses in layers to increase the volume to be filled by the gate metal, polishing layers, etc.

Challenges may exist, however, in that such integration schemes are often complicated and error prone. For example, it is difficult to recess a gate stack in which multiple layers need to be etched simultaneously. For example, a p-FET and/or n-FET gate stack will often require three or more layers to be etched simultaneously. When the recessing process is done unevenly, device errors may occur. As such, a need exists for a more simplified and reliable integration scheme.

SUMMARY OF THE INVENTION

In general, the present invention provides approaches for forming a semiconductor device (e.g., a FET) having a multi-function layer (e.g., NbC) that serves as a work function layer and a gate metal layer in the gate stacks thereof. By introducing a single layer with multiple functions, the number of total layers needing processing (e.g., recessing) may be decreased. As such, the complexity of device integration and resulting complications may be reduced.

A first aspect of the present invention provides a method of forming a semiconductor device, comprising: applying a high-k dielectric layer and a work function (WF) layer over a p-FET portion and an n-FET portion of the semiconductor device; removing the WF layer from over the n-FET portion; recessing the high-k dielectric layer and the WF layer over the p-FET portion and recessing the high-k dielectric layer over the n-FET portion; applying a multi-function layer over the p-FET portion and the n-FET portion; and recessing the multi-function layer over the p-FET portion and the n-FET portions.

A second aspect of the present invention provides a method of forming a semiconductor device, comprising: applying a high-k dielectric layer and a work function (WF) metal layer over a p-FET portion and an n-FET portion of the semiconductor device; removing the WF metal layer from over the n-FET portion; recessing the high-k dielectric layer and the WF metal layer over the p-FET portion and the high-k dielectric layer over the n-FET portion; applying a glue layer over the WF metal layer of the p-FET portion and over the high-k layer of the n-FET portion; applying a multi-function layer including niobium carbide (NbC) over the glue layer of the p-FET portion and the n-FET portion; recessing the glue layer and the multifunction layer; and applying a cap layer over the recessed glue layer and multifunction layer.

A third aspect of the present invention provides a semiconductor device, comprising: a p-FET portion having a first gate stack thereon, the first gate stack comprising a first high-k dielectric layer over the p-FET portion, a first work function (WF) metal layer over the first high-k dielectric layer, and a first niobium carbide (NbC) multi-function layer over the first WF metal layer; and a n-FET portion having a second gate stack thereon, the second gate stack comprising a second high-k dielectric layer over the n-FET portion, and a second NbC multi-function layer over the second high-k dielectric layer.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, the present invention provides approaches for forming a semiconductor device (e.g., a FET) having a multi-function layer (e.g., NbC) that serves as a work function metal layer and a gate metal layer in gate stacks of the device. By introducing a single layer having multiple functions, the quantity of total layers needing processing (e.g., recessing) may be decreased. As such, the complexity of device integration and resulting complications may be reduced.

In general, this disclosure will refer to multiple layers of a semiconductor device such as a field effect transistors (FETs) that may comprise negative channel field effect transistor (n-FET) portions as well as positive channel field effect transistor (p-FET) portions. Furthermore, such portions may include a set (i.e., one or more) of gate stacks having multiple layers (e.g., high-k layers, work function metal layers, seed/glue layers, cap layers, etc.) that are subject to various types of processing (e.g., depositing, etching, recessing, polishing, etc.). Along these lines, the term high-k layer refers to a material with a high dielectric constant and work function (WF) is defined as the amount of enegery that is required to remove an electron from the Fermi level of the solid to vacuum.

A common way is to etch away the part of WF metals and replace the etched part with a low resistivity metal such as W (tungsten) or Al (aluminum). The metal etching process should not attack high-k underneath WF metal.

Figure 1:
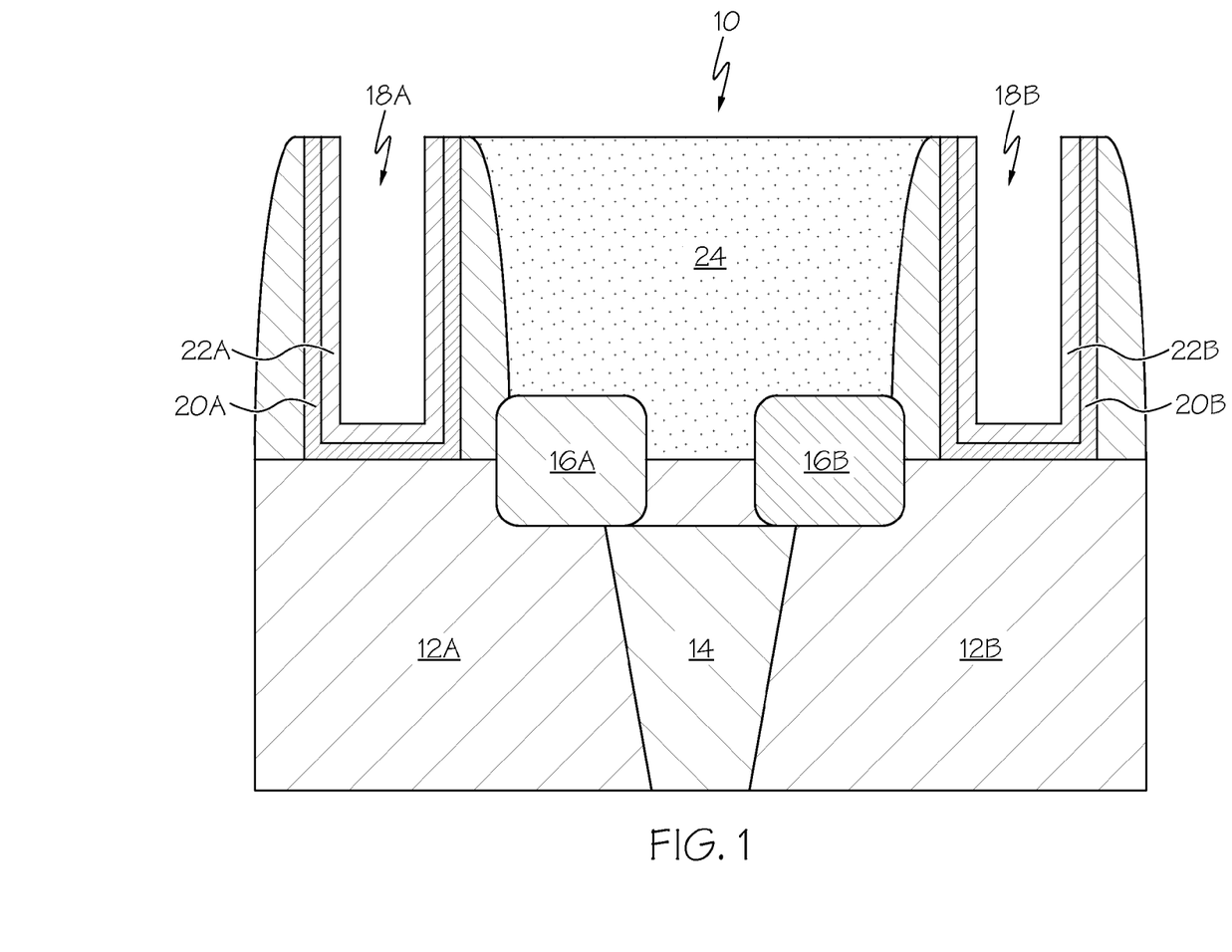
FIG. 1 shows a cross-section view of a semiconductor device during its formation according to an embodiment of the present invention.

FIGS. 1-6 generally show the progression of formation (i.e., integration scheme) of a semiconductor device 10 according to an embodiment of the present invention. As depicted in FIG. 1, device 10 generally includes a p-FET portion 12A and an n-N-FET portion 12B separated by shallow trench isolation (STI) 14. A set of gate stacks 18A-B, separated by epitaxial regions 16A-B, are positioned on p-FET portion 12A and n-FET portion 12B, respectively. To construct gate stacks 18A-B, high-k layers 20A-B and WF (metal) layers (e.g., TiN) 22A-B are applied (e.g., via atomic layer deposition (ALD)) in trenches thereof.

Figure 2:
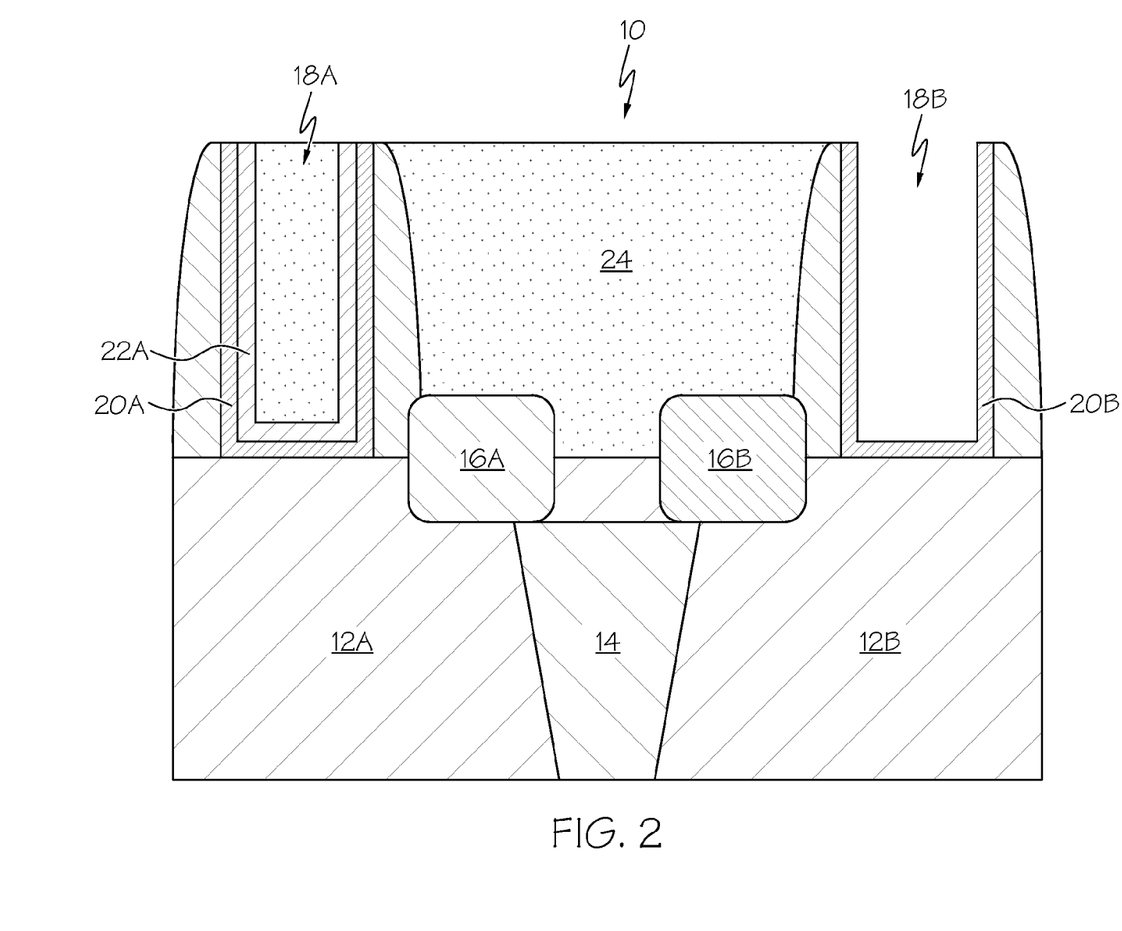
FIG. 2 shows another cross-section view of a semiconductor device during its formation according to an embodiment of the present invention.

As shown in FIG. 2, the WF layer 22B has been removed (e.g., etched away) from gate stack 18B. As such, gate stack 18A still includes high-k layer 20A and WF layer 22A, while gate stack 18B includes high-k layer 20B (WF layer 22B no longer present).

Figure 3:
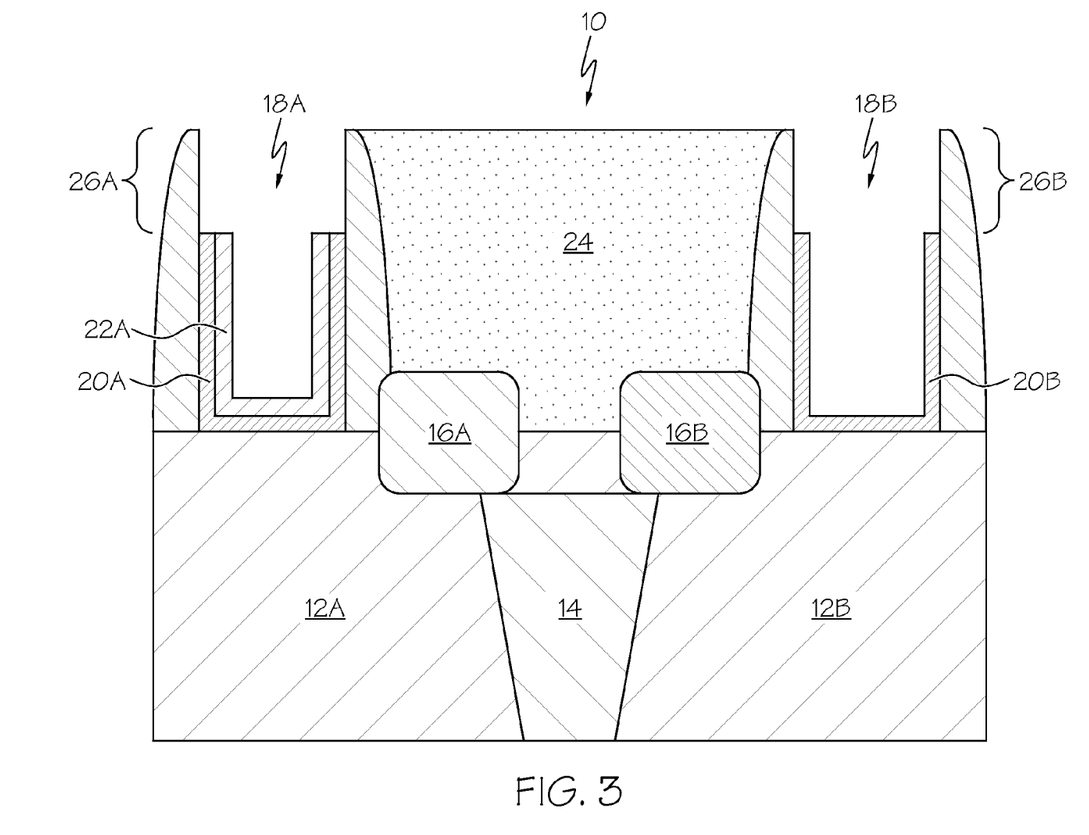
FIG. 3 shows another cross-section view of a semiconductor device during its formation according to an embodiment of the present invention.

As shown in FIG. 3, a simultaneous recessing process will occur (e.g., via a mash etching process). Specifically, high-k layer 20A and WF layer 22A of gate stack 18A will be partially removed/recessed to yield a recess 26A. Similarly, high-k layer 20B of gate stack 18B will be removed/recessed to yield a recess 26B. It is understood that gate stacks 18A-B may be recessed substantially with respect to one another. Moreover, multiple layers 20A and 22A of gate stack 18A may be recessed simultaneously with respect to one another.

Figure 4:
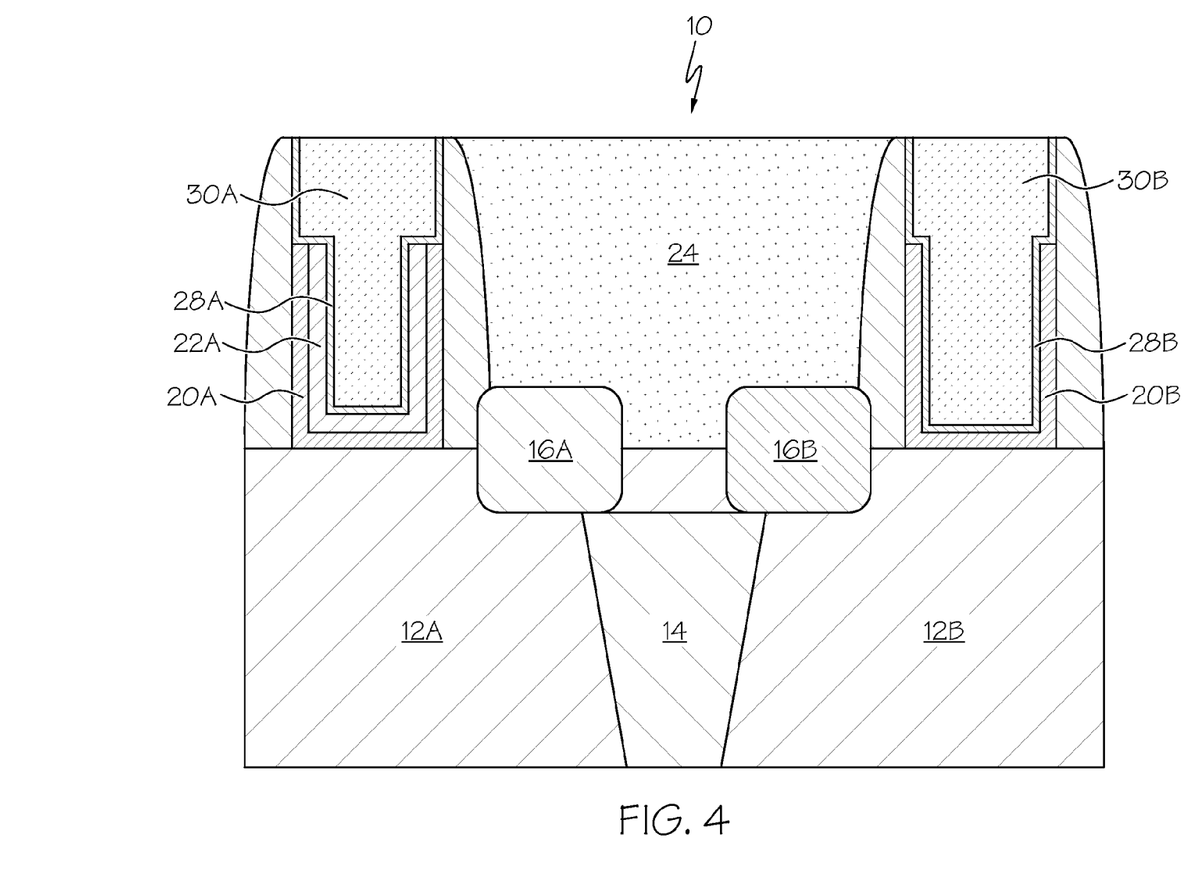
FIG. 4 shows another cross-section view of a semiconductor device during its formation according to an embodiment of the present invention.

As shown in FIG. 4, multi-function layers 30A-B will be applied (e.g., via CVD, ALD, PVD etc.) to gate stacks 18A-B, respectively. Specifically, a glue/seed layer 28A will be applied over high-k layer 20A and WF layer 22A of gate stack 18A. Similarly, a glue/seed layer 28B will be applied over high-k layer 20B of gate stack 18B. Glue layers 28A-B will help multi-function layers 30A-B to adhere to gate stacks 18A-B. Moreover, glue layers 28A-B act as a diffusion barrier for materials that may be introduced during the deposition of multi-function layers 30A-B. Along these lines, the glue layers described herein may be TiN,TaN or the like. However, it is understood that the teachings recited herein are not intended to be limited to such compounds and other compounds may be utilized as a glue layer/diffusion barrier. Multi-function layers 30A-B are niobium carbide (NbC), which function as a WF (metal) layer for n-FET as well as a gate metal layer for both n-FET and p-FET. Such an implementation allows for the total number of layers to be reduced in device 10.

Figure 5:
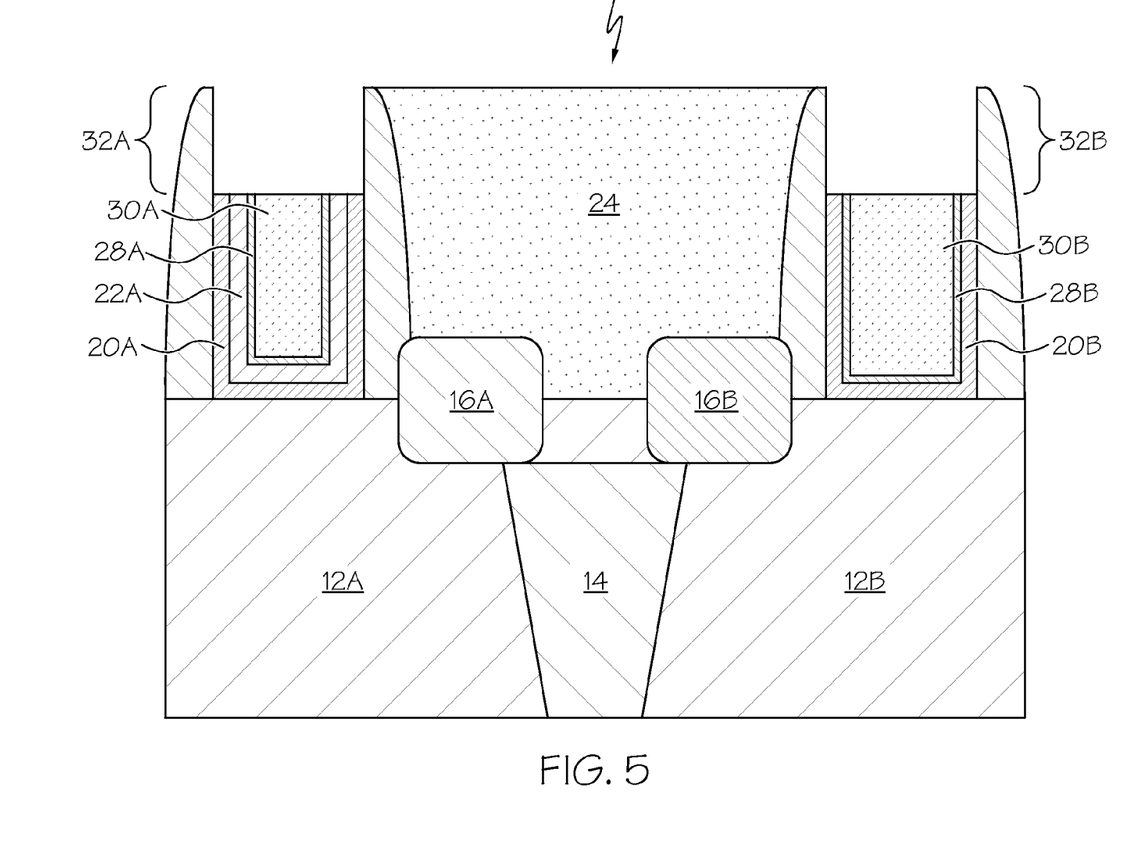
FIG. 5 shows another cross-section view of a semiconductor device during its formation according to an embodiment of the present invention.

In any event, as shown in FIG. 5, glue layers 28A-B and multi-function layers 30A-B will then be partially removed/recessed (e.g., via a mask etching process) to yield a set of recesses 32A-B in gate stacks 18A-B. Similar to the recessing process shown and described in conjunction with FIG. 3, glue layers 28A-B and multi-function layers 30A-B of each gate stack 18A-B may be recessed simultaneously.

Figure 6:
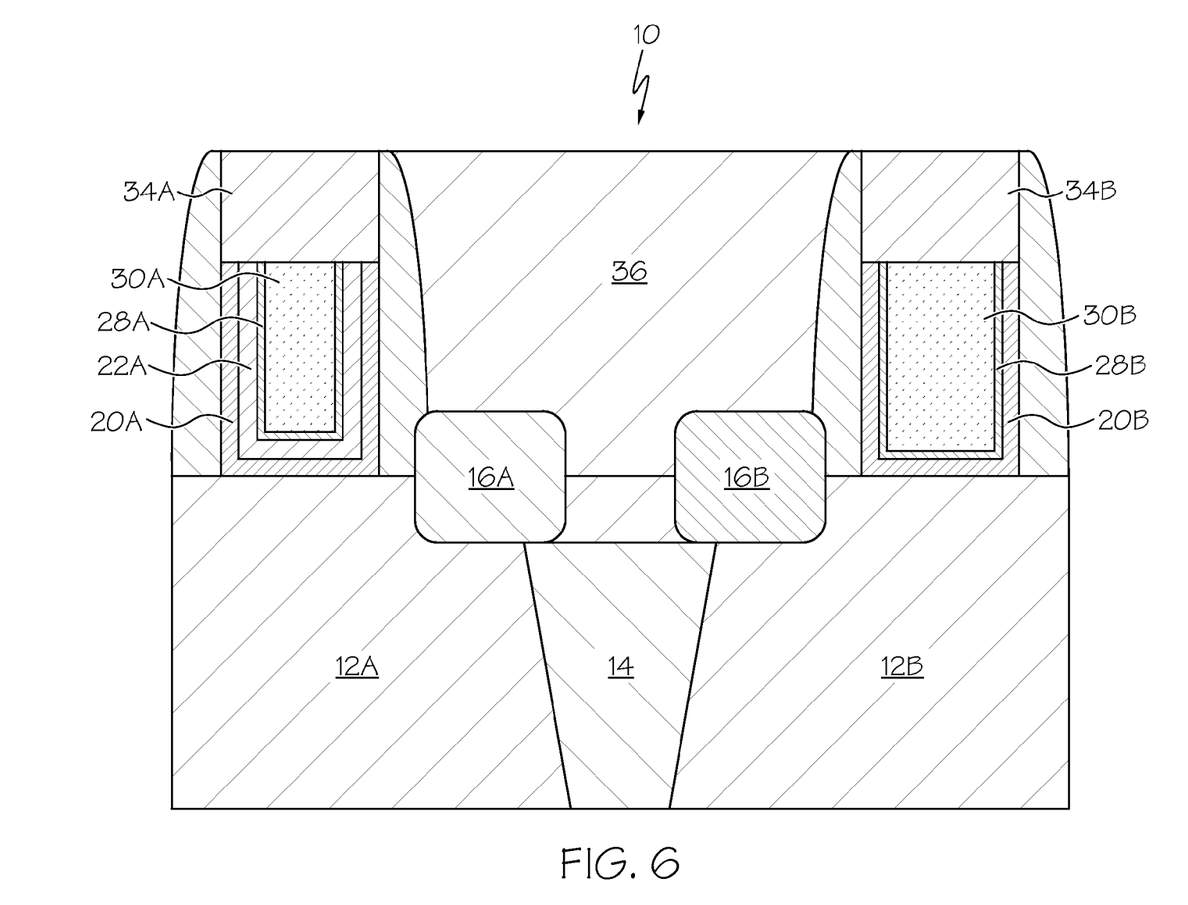
FIG. 6 shows another cross-section view of a semiconductor device during its formation according to an embodiment of the present invention.

As then shown in FIG. 6, device 10 is shown after formation/application of cap layers 34A-B and polishing thereof (e.g., via chemical mechanical polishing (CMP)) over multi-function layers 30A-B, glue layers 28A-B, WF layer 22A, and high-k layers 20A-B. As further shown, device 10 further includes an oxide layer 36 as well as the aforementioned p-FET portion 12A, n-FET portion 12B, STI 14, and epitaxial regions 16A-B.

In various embodiments, design tools can be provided and configured to create the data sets used to pattern the semiconductor layers as described herein. For example data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different order and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor device, comprising:
    applying a high-k dielectric layer and a work function (WF) layer over a p-FET portion and an n-FET portion of the device;
    removing the WF layer from over the n-FET portion;
    recessing the high-k dielectric layer and the WF layer over the p-FET portion and recessing the high-k dielectric layer over the n-FET portion;
    applying a multi-function layer over the p-FET portion and the n-FET portion;
    recessing the multi-function layer over the p-FET portion, resulting in exposure of a Portion of the high-k dielectric layer and a portion of the WF layer over the p-FET portion;
    recessing the multifunction layer over the n-FET portion, resulting in exposure of the high-k dielectric layer over the n-FET portion; and
    applying a cap layer into direct contact with the portion of the WF layer, the portion of the high-k dielectric layer, and a portion of the multi-function layer over the p-FET portion.

2. The method of claim 1, further comprising applying a glue layer over the WF layer over the p-FET portion and over the high-k layer over the n-FET portion, the multi-function layer being applied over the glue layer.

3. The method of claim 1, the WF layer comprising titanium nitride (TiN) or tantalum nitride (TaN).

4. The method of claim 1, the multi-function layer comprising niobium carbide (NbC).

5. The method of claim 1, the multi-function layer functioning as a gate metal layer for the p-FET portion, the n-FET portion, and as a WF layer for the n-FET portion.

6. The method of claim 1, the simultaneous recessing of the high-k dielectric layer and the WF layer over the p-FET portion and the recessing of the high-k dielectric layer over the n-FET.

7. The method of claim 1, further comprising applying a cap layer over the multi-function layer over the n-FET portion.

8. The method of claim 7, further comprising polishing the cap layer.

9. A method of forming a semiconductor device, comprising:
    applying a high-k dielectric layer and a work function (WF) metal layer over a p-FET portion and an n-FET portion of the semiconductor device;
    removing the WF metal layer from over the n-FET portion;
    recessing the high-k dielectric layer and the WF metal layer over the p-FET portion and the high-k dielectric layer over the n-FET portion;
    applying a glue layer over the WF metal layer of the p-FET portion and over the high-k layer of the n-FET portion;
    applying a multi-function layer comprising niobium carbide (NbC) over the glue layer of the p-FET portion and the n-FET portion;
    recessing the glue layer and the multifunction layer over the p-FET portion, resulting in exposure of a Portion of the high-k dielectric layer and a Portion of the WF metal layer over the p-FET portion;
    recessing the glue layer and the multifunction layer over the n-FET portion, resulting in exposure of a Portion of the high-k dielectric layer over the n-FET portion; and
    applying a cap layer into direct contact with a portion of the recessed glue layer, the portion of the high-k layer, the portion of the WF layer, and the portion of the multi-function layer over the p-FET portion.

10. The method of claim 9, the WF metal layer comprising titanium nitride (TiN) or tantalum nitride (TaN).

11. The method of claim 9, the multi-function layer functioning as a gate metal layer for the p-FET portion, the n-FET portion, and as a WF layer for the n-FET portion.

12. The method of claim 9, the simultaneous recessing of the high-k dielectric layer and the WF metal layer over the p-FET portion and the recessing of the high-k dielectric layer over the n-FET.

13. The method of claim 9, further comprising polishing the cap layer.

* * * * *

UNITED STATES PATENT AND TRADEMARK OFFICE
CERTIFICATE OF CORRECTION

| | | |
|---|---|---|
| PATENT NO. | : 8,859,368 B2 | Page 1 of 1 |
| APPLICATION NO. | : 13/602839 | |
| DATED | : October 14, 2014 | |
| INVENTOR(S) | : Derya Deniz | |

It is certified that error appears in the above-identified patent and that said Letters Patent is hereby corrected as shown below:

Title Page, (74) Attorney, Agent, or Firm - Maxine L. Barasch; Delete "Keohana" and insert -- Keohane --.

Signed and Sealed this
Seventeenth Day of February, 2015

Michelle K. Lee
*Deputy Director of the United States Patent and Trademark Office*